US006455221B2

(12) United States Patent
Hayashi

(10) Patent No.: US 6,455,221 B2
(45) Date of Patent: Sep. 24, 2002

(54) COMBINATION OF THERMAL TRANSFER FILM AND THERMALLY SENSITIVE COLOR DEVELOPING PAPER AND RECORDING METHOD

(75) Inventor: Masafumi Hayashi, Tokyo-to (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 0 days.

(21) Appl. No.: 09/731,288

(22) Filed: Dec. 6, 2000

(30) Foreign Application Priority Data

Dec. 10, 1999 (JP) ........................................ P11-351072

(51) Int. Cl.[7] ............................ G03C 5/56; G03C 1/73; G03C 7/00; G03C 8/26; G03F 7/34

(52) U.S. Cl. ....................... 430/200; 430/261; 430/333; 430/964; 430/965; 503/227

(58) Field of Search ................................ 430/200, 261, 430/333, 964, 965; 503/227

(56) References Cited

U.S. PATENT DOCUMENTS 5,380,607 A * 1/1995 Van Haute et al. ......... 430/200

FOREIGN PATENT DOCUMENTS

| | | |
|---|---|---|
| JP | 56/157395 | * 12/1981 |
| JP | 59/42996 | * 3/1984 |
| JP | 3/234669 | * 10/1991 |
| JP | 7/186543 | * 7/1995 |

* cited by examiner

*Primary Examiner*—Richard L. Schilling
(74) *Attorney, Agent, or Firm*—Ladas & Parry

(57) ABSTRACT

The present invention uses a thermal transfer film in combination with a thermally sensitive color developing paper. The hue of the thermal transfer ink layer or the hue of the developed color of the color developing paper can be recorded on the color developing paper when the applied energy is low, and a plurality of colors can be recorded on the color developing paper by color mixture of the transfer from the thermal transfer ink layer and the developed color of the color developing paper when the applied energy is high.

29 Claims, 1 Drawing Sheet

COMBINATION OF THERMAL TRANSFER FILM AND THERMALLY SENSITIVE COLOR DEVELOPING PAPER AND RECORDING METHOD

BACKGROUND OF THE INVENTION

1. Field of the Invention

The present invention relates to a combination of a thermal transfer film and a thermally sensitive color developing paper capable of easily recording a plurality of colors on the thermally sensitive color developing paper, a composite thermal transfer sheet composed of them and a recording method using the same, in particular, those for recording a plurality of colors on the thermally sensitive color developing paper by utilizing the difference of recorded hues with a low energy and with a high energy in a large printer dedicated for a thermally sensitive color developing paper.

2. Description of the Related Art

Conventionally, there have been proposed various kinds of multi-color recording methods using a thermally fusible transfer sheet having a thermal transfer coloring layer with a coloring agent such as a pigment and a dye dispersed in a binder such as a thermally fusible wax and a resin.

For example, examples of a two-color recording with a combination of a thermally fusible transfer sheet and a thermally sensitive color developing paper can be presented as follows.

Japanese Patent Application Laid-Open (JP-A) No. Sho-56-157395 discloses a combination of a thermally sensitive color developing paper that starts color development at a temperature lower than the melting point of a thermal transfer ink, and a thermally fusible transfer sheet having a thermal transfer ink of a hue different from that of the color development, in which they are brought into contact with each other. Moreover, Japanese Patent Application Laid-Open (JP-A) No. Sho-59-42996 discloses a method of superimposing a thermally sensitive color developing paper that starts color development at a temperature higher than the transfer temperature of a thermal transfer ink, and a thermally fusible transfer sheet having a thermal transfer ink of a hue different from that of the color development, obtaining the thermal transfer ink hue by heating at a low temperature, and obtaining a mixed color of the thermal transfer ink and the developed color of the thermally sensitive color developing paper by heating at a high temperature.

As the similar methods thereto, Japanese Patent Application Laid-Open (JP-A) No. Hei-3-234669 as a high temperature color developing paper type. Further, Japanese Patent Application Laid-Open (JP-A) No. Hei-7-186543 as a high temperature color developing paper type method first forming a color developed image on a thermally sensitive color developing paper, and then transferring a thermal transfer ink from a thermally fusible transfer sheet can be presented.

In the conventional methods, the primal shortcoming is that a preferable black color cannot be recorded but a reddish black color, or the like is recorded by a color mixture of a bright color (in particular, a reddish color) and a dark color (for example, black color) at the time of black recording with a high energy.

Moreover, Japanese Patent Application Laid-Open (JP-A) No. Sho-61-61891 comprises a first ink layer for developing and transferring a color onto a substrate at a predetermined heating temperature, and a second ink layer disposed on the first ink layer for transferring at a heating temperature lower than the predetermined heating temperature.

Japanese Patent Application Laid-Open (JP-A) No. Sho-59-136286 comprises a combination of a transfer sheet provided with a high temperature transfer layer and a low temperature transfer layer containing a leuco dye for developing a color different from that of the high temperature transfer layer successively on a substrate, and a receiving sheet having a receptor layer containing a color developing agent, wherein an anti-coloring agent is contained either in the high temperature transfer layer or in an intermediate layer between the high temperature transfer layer and the low temperature transfer layer.

Furthermore, various methods with a multi-plies (multi-layered) thermally fusible transfer sheet have been proposed.

For example, Japanese Patent Application Laid-Open (JP-A) No. Sho-61-61892 discloses a multi-plies thermally fusible ink layer with the melting points thereof lowered from the substrate side to the surface layer side gradually. Although a multi-plies configuration of the transfer layers of a thermally fusible transfer sheet has been adopted, in either case, it is extremely difficult to control the applied energy for controlling the transfer amount for each transferable ply in the multi-plies transfer layer.

Moreover, Japanese Patent Application Laid-Open (JP-A) No. Sho-55-97983 discloses a method of providing a thermal transfer sheet in which a thermally sensitive color developing layer transferable is disposed on a substrate, and also providing an image receiving sheet having a receptor layer containing solid fatty acids and/or solid fatty acid amides, and applying a heat treatment after transferring the thermally sensitive color developing layer so as to improve the printing density (substantially monochrome printing density).

Furthermore, as a method for two-color recording, Japanese Patent Application Laid-Open (JP-A) No. Sho-61-137789 discloses a method for achieving two-color printing on a member to be recorded by superimposing a thermal transfer sheet provided with a thermally fusible first ink layer and a thermally fusible second ink layer of different tones, and a member to be recorded, and changing the time of peeling them off after printing. According to the method, the load of the software and the hardware for controlling the peel-off time on a printer machine is high. Furthermore, a printer dedicated for a thermally sensitive color developing paper does not have a peeling off mechanism in most cases, and thus it cannot be applied practically.

SUMMARY OF THE INVENTION

Accordingly, in view of the above-mentioned problems, an object of the prevent invention is to achieve vivid recording of a bright color and a dark color easily by one thermal transfer film to be loaded on a printer dedicated for a thermally sensitive color developing paper without a winding up mechanism for a thermal transfer film by varying the applied energy.

In order to achieve the above-mentioned object, the present invention provides, as one aspect, a combination of a thermal transfer film and a thermally sensitive color developing paper.

In a first embodiment of the combination, the thermal transfer film is provided with a thermally fusible ink layer to be transferred onto the thermally sensitive color developing paper on one surface of a substrate film, and the thermally sensitive color developing paper is capable of developing a color of a hue different from that of the thermally fusible ink layer of the thermal transfer film, wherein a red hue can be recorded on the thermally sensitive color developing paper by the transfer of the thermally fusible ink or by the developed color of the thermally sensitive color developing paper in the case the applied energy is relatively low, a plurality of colors can be recorded on the thermally sensitive color developing paper according to color mixture of the transfer of the thermally fusible ink and the developed color of the thermally sensitive color developing paper in the case the applied energy is relatively high, and a* is 40 to 70, b* is 0 to 25, and C* is 40 to 75 in the red hue recorded by the transfer of the thermally fusible ink or by the developed color of the thermally sensitive color developing paper, and a* is 0 to 20, b* is 0 to 10, and C* is 0 to 20 in the black hue recorded by the color mixture of the transfer of the thermally fusible ink and the developed color of the thermally sensitive color developing paper.

Use of the first embodiment of the combination according to the present invention makes it possible to vividly and easily record a bright color and a dark color by one thermal transfer film.

In the first embodiment of the combination, in the case the thermally fusible ink layer of the thermal transfer film has a red hue, it is preferable that the thermally sensitive color developing paper is capable of generating a black hue of $|a^*| \leqq 5$ and $|b^*| \leqq 3$.

In a second embodiment of the combination, the thermal transfer film is provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue, and red, which is different from the hue of the thermally fusible ink layer of the thermal transfer film.

It can be loaded on a printer dedicated for a thermally sensitive color developing paper as well as multi-color recording can be enabled easily by varying the applied energy. That is, in the case the applied energy is low, the hue of only the thermal transfer ink layer or the hue of only the developed color of the thermally sensitive color developing paper can be recorded, or in the case the applied energy is high, the hue of a color mixture of the transfer from the thermal transfer ink layer and the developed color of the thermally sensitive color developing paper can be recorded by one thermal transfer film.

In the case the thermal transfer ink layer of the thermal transfer film is capable of recording a blue hue on the thermally sensitive color developing paper by transferring the thermal transfer ink on said color developing paper at a temperature lower than a color developing temperature of said color developing paper or in the case the thermally sensitive color developing paper is capable of recording a blue hue at a temperature lower than thermally transferring temperature of said thermal transfer film, it is preferable that the blue hue recorded in a printing part of the color developing paper when applying a low energy has a* in a range of 0 to 30, b* in a range of −40 to −70, and C* in a range of 30 to 77.

Further in this case, when the applied energy is high, it is preferable to record a black hue on the thermally sensitive color developing paper by a color mixture of the transfer from the thermal transfer ink layer and the developed color of the thermally sensitive color developing paper, and the black hue recorded by the color mixture preferably has a* in a range of −10 to 10, b* in a range of −15 to 10, and C* in a range of 0 to 18.

In the other case the thermal transfer ink layer of the thermal transfer film is capable of recording a purple hue on the thermally sensitive color developing paper by transferring the thermal transfer ink on said color developing paper at a temperature lower than a color developing temperature of said color developing paper, it is preferable that the purple hue recorded in a printing part of the color developing paper when applying a low energy has a* in a range of 30 to 50, b* in a range of −30 to −50, and C* in a range of 42 to 71.

Further in this case, when the applied energy is high, it is preferable to record a black hue on the thermally sensitive color developing paper by a color mixture of the transfer from the thermal transfer ink layer and the developed color of the thermally sensitive color developing paper, and the obtained black hue recorded by the color mixture preferably has a* in a range of −10 to 20, b* in a range of −15 to 10, and C* in a range of 0 to 25.

In the still other case the thermal transfer ink layer of the thermal transfer film is capable of recording a green hue on the thermally sensitive color developing paper by transferring the thermal transfer ink on said color developing paper at a temperature lower than a color developing temperature of said color developing paper, it is preferable that the green hue recorded in a printing part of the color developing paper when applying a low energy has a* in a range of −40 to −70, b* in a range of −15 to 5, and C* in a range of 0 to 72.

Further in this case, when the applied energy is high, it is preferable to record a blue hue on the thermally sensitive color developing paper by a color mixture of the transfer from the thermal transfer ink layer and the developed color of the thermally sensitive color developing paper, and the obtained blue hue recorded by the color mixture preferably has a* in a range of −5 to 15, b* in a range of −70 to −30, and C* in a range of 30 to 72.

It is preferable for the first and the second embodiment of the combination that a pigment of a C. I. Pigment red 177 or C. I. Pigment blue 15:4 is contained in the thermal transfer ink layer of the above-mentioned thermal transfer film. By containing a pigment of the C. I. Pigment red 177 or a C. I. Pigment blue 15:4 in the thermal transfer ink layer of the thermal transfer film, a vivid hue can be obtained. Moreover, it is preferable to contain a black pigment in the thermal transfer ink layer.

Moreover, it is preferable that any of the above-mentioned embodiments are provided as a composite thermal transfer sheet in which the thermal transfer film and the thermally sensitive color developing paper are peelably bonded together with the thermally fusible ink layer and the color developing surface facing to each other. Furthermore, they can be provided as a composite thermal transfer sheet with a temporary adhesive layer disposed between the thermal transfer film and the thermally sensitive color developing paper.

The present invention also provides, as the other aspect, a recording method of heating a thermal transfer film and a thermally sensitive color developing paper brought into contact with each other by using the above described combinations, in particular, the composite type.

In a first embodiment of the recording method according to the present invention, any one of the combination described above is used in such manner that the hue of the thermal transfer ink layer is recorded on the thermally sensitive color developing paper in the case the applied energy from the heating device is low, and a plurality of colors is recorded on the thermally sensitive color developing paper by color mixture of the transfer from the thermal transfer ink layer and the developed color of the thermally sensitive color developing paper in the case the applied energy is high.

In a second embodiment of the recording method according to the present invention, any one of the combination described above is used in such manner that the hue of the developed color of the thermally sensitive color developing paper is recorded in the case the applied energy from the heating device is low, and a plurality of colors is recorded on the thermally sensitive color developing paper by color mixture of the transfer from the thermal transfer ink layer and the developed color of the thermally sensitive color developing paper in the case the applied energy is high.

DESCRIPTION OF THE PREFERRED EMBODIMENTS

Figure 1:
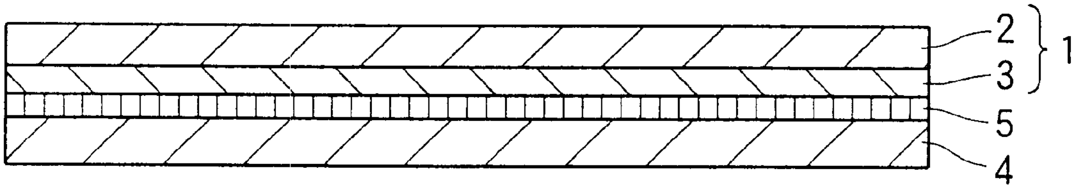
FIG. 1 is a schematic cross-sectional view of an example of a combination of a thermal transfer film and a thermally sensitive color developing paper according to the present invention.

Hereinafter embodiments of the present invention will be described in detail.

As shown in FIG. 1, the present invention uses a thermal transfer film 1 in combination with a thermally sensitive color developing paper 4. The thermal transfer film 1 comprises a substrate film 2, on one surface of which a thermally fusible ink layer 3. The thermal transfer film 1 and the thermally sensitive color developing paper 4 is brought into contact with each other so as to face the thermally fusible ink layer 3 of the former to color developing surface of the latter, and they are heated by means of a heating means such as a thermal head, thus printing on the thermally sensitive color developing paper 4.

It is preferable to integrate the thermal transfer film 1 and the thermally sensitive color developing paper 4 by peelably bonding the thermal transfer ink layer side to the thermally sensitive color developing surface. They may be peelably bonded via a temporary adhesive layer 5.

Substrate Film

As a substrate film to be used in a thermal transfer film of the present invention, the substrate films used in the conventional thermal transfer films can be used as well as the other ones can be used, and it is not particularly limited.

Examples of preferable substrate films include plastics with a relatively good heat resistance, such as polyester such as polyethylene terephthalate, polypropylene, cellophane, polycarbonate, cellulose acetate, triacetyl cellulose, polyethylene, polyvinyl chloride, polystyrene, nylon, polyimide, polyvinylidene chloride, polyvinyl alcohol, fluorine resin, chlorinated rubber, and ionomer; papers such as a condenser paper and a paraffin paper; and non-woven fabrics. Further, composite substrate films thereof can be used as well.

The thickness of the substrate film can be changed optionally according to the material such that appropriate strength and heat conductivity can be obtained. The thickness is preferably, for example, 2 to 25 $\mu$m.

Thermal Transfer Ink Layer

A thermal transfer ink layer disposed on the substrate film of the thermal transfer film according to the present invention comprises a coloring agent and a binder, optionally further added with various kinds of additives such as a dispersing agent and an antistatic agent.

As the coloring agent, among organic or inorganic pigments or dyes, one having characteristics preferable for a recording material, specifically, a sufficient coloring concentration without the risk of discoloration or fading with respect to light, heat or temperature is preferable. Moreover, as the coloring agent, an appropriate material selected from the group consisting of carbon black, an organic pigment, an inorganic pigment, and various dyes can be used according to the tone to be demanded.

In a thermal transfer film according to the present invention, it is preferable to combine with a thermally sensitive color developing paper for developing a color of a hue different from that of the transfer ink such that at least one pigment selected from the group consisting of blue, green, red, purple, and black pigments is contained in the transfer ink layer, and the thermally sensitive color developing paper with a developed color hue of any one selected from the group consisting of black, blue, and red is used.

The reason of selecting black, blue or red for a developed color hue of the thermally sensitive color developing paper is that a thermally sensitive color developing papers which is commercially available or capable of being easily prepared from material commercially available is any one of the above-mentioned black, blue and red in most cases.

In the case the developed color hue of the thermally sensitive color developing paper is black, the hue of the thermal transfer ink layer to be used in a combination with the thermally sensitive color developing paper is preferably blue, green, red or purple, other than black.

In the case the developed color hue of the thermally sensitive color developing paper is blue, the hue of the thermal transfer ink layer to be used in a combination with the thermally sensitive color developing paper is preferably green, red, purple or black, other than blue. In particular, red and black can be used preferably in this case.

Furthermore, in the case the developed color hue of the thermally sensitive color developing paper is red, the hue of the thermal transfer ink layer to be used in a combination with the thermally sensitive color developing paper is preferably blue, green, purple or black, other than red. In particular, blue, green, and black can be used preferably in this case.

In the case the thermal transfer ink layer of the thermal transfer film is capable of recording a red hue on the thermally sensitive color developing paper by transferring the thermal transfer ink on said color developing paper at a temperature lower than a color developing temperature of said color developing paper or in the case the thermally sensitive color developing paper is capable of recording a red hue at a temperature lower than thermally transferring temperature of said thermal transfer film, it is preferable that the red hue recorded in a printing part of the color developing paper when applying a low energy has $a^*$ in a range of 40 to 70, $b^*$ in a range of 0 to 25, and $C^*$ in a range of 40 to 75.

Further in this case, when the applied energy is high, it is preferable to record a black hue on the thermally sensitive color developing paper by a color mixture of the transfer from the thermal transfer ink layer and the developed color of the thermally sensitive color developing paper, and the obtained black hue recorded by the color mixture preferably has a* in a range of 0 to 20, b* in a range of 0 to 10, and C* in a range of 0 to 20.

When the thermal transfer film has a red ink layer fusible at a relatively low temperature, a vivid red (slightly yellowish golden red) hue can be recorded by using the C. I. Pigment red 177 as a pigment in the thermal transfer ink layer. The C. I. Pigment red 177 is a threne based pigment represented by the below-mentioned chemical formula 1, that is, a condensed polycyclic type red pigment also called as dianthraquinonyl red.

FORMULA 1

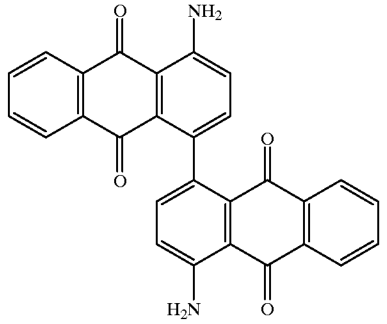

In the case the thermal transfer ink layer of the thermal transfer film is capable of recording a blue hue on the thermally sensitive color developing paper by transferring the thermal transfer ink on said color developing paper at a temperature lower than a color developing temperature of said color developing paper or in the case the thermally sensitive color developing paper is capable of recording a blue hue at a temperature lower than thermally transferring temperature of said thermal transfer film, it is preferable that the blue hue recorded in a printing part of the color developing paper when applying a low energy has a* in a range of 0 to 30, b* in a range of −30 to −70, and C* in a range of 30 to 77.

Further in this case, when the applied energy is high, it is preferable to record a black hue on the thermally sensitive color developing paper by a color mixture of the transfer from the thermal transfer ink layer and the developed color of the thermally sensitive color developing paper, and the obtained black hue recorded by the color mixture preferably has a* in a range of −10 to 10, b* in a range of −15 to 10, and C* in a range of 0 to 18.

When the thermal transfer film has a blue ink layer fusible at a relatively low temperature, a vivid blue hue can be recorded by using the C. I. Pigment blue 15:4 as a pigment in the thermal transfer ink layer. The C. I. Pigment blue 15:4 is a phthalocyanine pigment represented by the below-mentioned chemical formula 2.

FORMULA 2

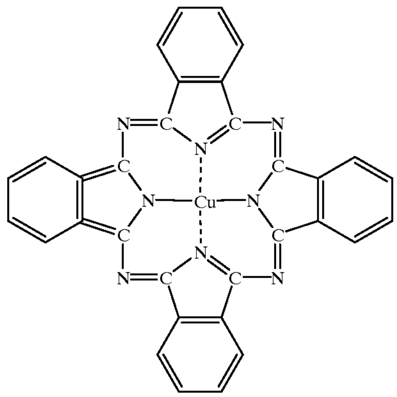

In the case the thermal transfer ink layer of the thermal transfer film is capable of recording a purple hue on the thermally sensitive color developing paper by transferring the thermal transfer ink on said color developing paper at a temperature lower than a color developing temperature of said color developing paper, it is preferable that the purple hue recorded in a printing part of the color developing paper when applying a low energy has a* in a range of 30 to 50, b* in a range of −30 to −50, and C* in a range of 42 to 71.

Further in this case, when the applied energy is high, it is preferable to record a black hue on the thermally sensitive color developing paper by a color mixture of the transfer from the thermal transfer ink layer and the developed color of the thermally sensitive color developing paper, and the obtained black hue recorded by the color mixture preferably has a* in a range of −10 to 20, b* in a range of −15 to 10, and C* in a range of 0 to 25.

When the thermal transfer film has a purple ink layer fusible at a relatively low temperature, the purple ink may be prepare with a purple pigment as a single coloring agent, or it may be prepare with combination use of two or more pigments which may be includes the above described the C. I. Pigment red 177 and the C. I. Pigment blue 15:4.

In the case the thermal transfer ink layer of the thermal transfer film is capable of recording a green hue on the thermally sensitive color developing paper by transferring the thermal transfer ink on said color developing paper at a temperature lower than a color developing temperature of said color developing paper, it is preferable that the green hue recorded in a printing part of the color developing paper when applying a low energy has a* in a range of −40 to −70, b* in a range of −15 to 5, and C* in a range of 0 to 72.

Further in this case, when the applied energy is high, it is preferable to record a blue hue on the thermally sensitive color developing paper by a color mixture of the transfer from the thermal transfer ink layer and the developed color of the thermally sensitive color developing paper, and the obtained blue hue recorded by the color mixture preferably has a* in a range of −5 to 15, b* in a range of −70 to −30, and C* in a range of 30 to 72.

When the thermal transfer film has a green ink layer fusible at a relatively low temperature, the green ink may be prepare with a green pigment as a single coloring agent, or it may be prepare with combination use of two or more pigments which may be includes the above described the C. I. Pigment red 177 and the C. I. Pigment blue 15:4.

When the thermal transfer film has a black ink layer, it may be prepare with an appropriate black pigment such as carbon black.

Among elements of the color spaces (the color systems) used in the present invention, a*, b* and L* are of the CIE 1976 (L*a*b*) space defined by the Commission Internationale, de l'Eclairage (CIE), which is also referred as JIS-Z 8729 in Japan. The a* and b* are chromaticities representing the hue and the chroma, and L* represents the brightness of the color.

Values of the a*, b* and L* can be calculated by putting the tristimulus values of XYZ color space which can be measured by the method defined in JIS-Z 8722 into the following equations.

First, the value of L* can be calculated by putting the tristimulus values of XYZ color space measured by JIS-Z 8722 into the following equation (1) when the value Y/Yn is more than 0.008856 (Y/Yn>0.008856), or putting the same into the following equation (2) when the value Y/Yn is not more than 0.008856 (Y/Yn≦0.008856).

$$L^*=116(Y/Yn)^{1/3}-16 \quad \text{Equation (1):}$$

$$L^*=903.29(Y/Yn) \quad \text{Equation (2):}$$

wherein the Y is the tristimulus values of XYZ color space, and the Yn is a value of the Y provided by the completely diffusing reflection surface with the standard light.

Next, the value of a* and b* can be calculated by putting the tristimulus values of XYZ color space measured by JIS-Z 8722 into the following equation (3) when the all values of X/Xn, Y/Yn and Z/Zn are more than 0.008856 (X/Xn>0.008856, Y/Yn>0.008856 and Z/Zn>0.008856). If at least one value among X/Xn, Y/Yn and Z/Zn is not more than 0.008856 (X/Xn≦0.008856 or Y/Yn≦0.008856 or Z/Zn≦0.008856), a corresponding term X/Xn, Y/Yn or Z/Zn appearing in the equation (3) should be substituted for [7.787(X/Xn)+16/116], [7.787(Y/Yn)+16/116] or [7.787(Z/Zn)+16/116].

$$a^*=500[(X/Xn)^{1/3}-(Y/Yn)^{1/3}]$$

$$b^*=200[(Y/Yn)^{1/3}-(Z/Zn)^{1/3}] \quad \text{Equation (2):}$$

wherein the X,Y and Z are the tristimulus values of XYZ color space, and the Xn, Yn and Zn are tristimulus values of XYZ color space provided by the completely diffusing reflection surface with the standard light.

Further, the C* represents the chroma, and it can be calculated by putting the values of the above described a* and b* into the following equation (4) which is defined in the CIE Publ. 15.2.

$$C^*=[(a^*)^2+(b^*)^2]^{1/2} \quad \text{Equation (4):}$$

In the practical measurement, respective values of a*, b*,C* and L* can be automatically detected by means of a colorimeter or color-difference meter such as CR-200 manufactured by the MINOLTA Corporation.

By the L*, a*, b* and C* in the above-mentioned equations, the color of the subject can be represented in the present invention.

A binder used in the thermal transfer ink layer is preferably composed of a resin and/or a wax as the main component. Specific examples of the resin include starches, celluloses, gelatin, casein, polyvinyl alcohols, melamine based resins, polyester based resins, polyamide based resins, polyolefin based resins, acrylic based resins, styrene based resins, urea resins, polyurethane resins, polyamide, maleic anhydride copolymers, ethylene-vinyl acetate copolymers, vinyl chloride-vinyl acetate copolymers, and thermoplastic elastomers such as styrene-butadiene rubber. In particular, those conventionally used as a thermally sensitive adhesive having a relatively low softening point, for example, in a range of 50 to 150° C. are preferable.

As the wax component, for example, microcrystalline wax, carnauba wax, paraffin wax, or the like, can be presented. Furthermore, various kinds of waxes, such as Fischer-Tropsch wax, various kinds of low molecular weight polyethylenes, wood wax, bee wax, whale wax, insect wax, wool wax, shellac wax, candelilla wax, petrolactam, polyester wax, partially denatured wax, aliphatic acid ester, and aliphatic acid amide can be used. Among these examples, those having a 50 to 85° C. melting point are particularly preferable. If it is less than 50° C., a problem is involved in the storage property, but if it is more than 85° C., the sensitivity in printing is insufficient.

The thermal transfer ink layer can be formed by mixing the above-mentioned coloring agent and binder, and further adding thereto an additive such as a dispersing agent, an antistatic agent as needed, and a solvent such as water and an organic solvent so as to prepare a thermal transfer ink layer forming coating liquid, and coating the same by a conventionally known method, such as gravure coat, gravure reverse coat, knife coat, air coat and roll coat by a 0.05 to 10 μm thickness in the dry state, preferably by 0.2 to 3 μm.

In the case the thickness of the dry coat film is less than 0.05 μm, a homogeneous ink layer cannot be obtained due to the problem of the film forming property, thus causing deterioration of the abrasion property of the printed product. In contrast, in the case the thickness is more than 10 μm, a high energy is required at the time of printing and transfer so that multi-color recording is difficult, that is, the printing operation can be executed only by a special thermal transfer printer, or the printing sensitivity is insufficient.

Back Surface Layer

A back surface layer can be provided to the back side of the substrate film in the thermal transfer film according to the present invention as needed. The back surface layer is a layer for protecting the substrate film from a high temperature at the time of heat application by the thermal head. In other words, it is a layer for preventing sticking of the thermal head and improving the sliding property.

A back surface layer can be formed from thermoplastic resins and thermosetting resins with a high heat resistance, and ultraviolet ray curing type resins and electron beam curing type resins can also be used. These resins is used to form the back surface layer in a form of thin film.

Resins preferably used for formation of the back surface layer are fluorine resins, silicone resins, polyimide resins, epoxy resins, phenol resins, malemine resins, or the like. Since the heat resistance of the supporting member can be improved extremely by providing the back surface layer, materials conventionally considered as inappropriate can also be used as the substrate film by providing the back surface layer.

The back surface layer may contain one or more additives such as a sliding agent, a surfactant, an inorganic particle, an organic particle, a pigment or the like.

The back surface layer can be formed by first adding a sliding agent, a surfactant, an inorganic particle, an organic particle, a pigment or the like, to a binder resin, dissolving or dispersing the same in an appropriate solvent so as to prepare a coating liquid, coating the same by commonly used coating means, such as a gravure coater, a roll coater, and a wire bar, and then drying.

Peeling Layer

A peeling layer can be provided between the substrate film and the thermal transfer ink layer in the thermal transfer film according to the present invention. It is preferable to provide the peeling layer with at least two selected from the group consisting of a thermoplastic resin particle, a thermoplastic resin, and a wax as the main components. The thermoplastic resin particle has an effect of providing the ruggedness on the peeling layer so as to improve the adhesion force (layer-retentivity) with the thermal transfer ink layer, an effect of forming a film at the time of heating and printing so as to lower the adhesion force with the substrate film and improving the transfer sensitivity, and an effect of forming a film on the printed product surface so as to improve the abrasion property. The wax has an effect of providing the adhesion property to the substrate film as a binder of the resin particle, an effect of improving the thermal transfer sensitivity for its low melt viscosity and not excessively high adhesion force to the substrate film, and an effect of improving the abrasion property by providing the sliding property on the printed product surface. The thermoplastic resin has an effect of providing the adhesion property to the substrate film as a binder of the resin particle for the adhesion property of the thermoplastic resin itself, and an effect of improving the adhesion force (layer retentivity) with the thermal transfer ink layer.

It is preferable that the above-mentioned thermal transfer film and thermally sensitive color developing paper may be peelably bonded together via a temporary adhesive layer so as to provide a composite thermal transfer sheet. In the composite thermal transfer sheet, it is preferable that the thermal transfer film with a thermal transfer ink layer formed on one surface of the substrate film and the thermally sensitive color developing paper as a member to be transferred are peelably bonded together so as to face the ink layer and the color developing surface to each other via the temporary adhesive layer as needed, and the peeling layer is disposed between the substrate film and the thermal transfer ink layer.

As a binder for the resin particle of the peeling layer, waxes are preferably used. Examples of the above-mentioned resin particle include thermoplastic resins such as polyethylene, ethylene-vinyl acetate copolymers, ethylene-ethylacrylate copolymers(EAA), ethylene-ethyl acrylate copolymers (EEA), polyvinyl alcohols, polystyrene, and ionomers. It can be selected in consideration of the adhesion property with the substrate film at the time of film formation. In particular, in the case a polyethylene terephthalate film is used as the substrate film, an ionomer resin with a metal ion bond introduced between the polymer principal chain by a metal ion such as an alkaline metal including sodium, and an alkaline earth metal including magnesium in an ethylene copolymer having a carboxyl group.

As a preferable ethylene copolymer having a carboxyl group, for example, a copolymer of an unsaturated carboxylic acid such as an acrylic acid and a methacrylic acid, and an ethylene can be presented. Although a thermoplastic resin generally tends to be fused on the substrate film when it is heated, in the present invention, a material to have (the adhesion force of the substrate film and the peeling layer) >(the adhesion force of the temporary adhesive layer and the thermal transfer image receiving paper) before heating, and (the adhesion force of the substrate film and the peeling layer)<(the adhesion force of the temporary adhesive layer and the thermal transfer image receiving paper) after heating should be selected.

Among the above-mentioned resins, those having a minimum film formation temperature (MFT) in a range of 50 to 120° C. are preferable. If the MFT is less than 50° C., it is difficult to raise the drying temperature to 50° C. or more in the peeling layer formation so that a problem is involved in the productivity of the thermal transfer film. In contrast, if the MFT is more than 120° C., the sensitivity of the obtained thermal transfer film is insufficient at the time of printing.

The above-mentioned resin needs to form the peeling layer in the particle state. It is preferable that the formed peeling layer has a rugged surface. Therefore, a resin particle is used as a resin emulsion (or a dispersion) with water, an organic solvent, or a mixture thereof used as the medium. The average particle size of the resin particle in the emulsion is preferably in the range from 0.05 to 10 μm. If the average particle size is less than 0.05 μm, the performance as the particle cannot be achieved. In contrast, if the average particle size is more than 10 μm, it is difficult to form a layer, and furthermore, the particles cannot fuse with each other at the time of the thermal transfer so as to deteriorate the film formation property, and thus the durability of the printed product, such as the abrasion property cannot be satisfactory.

As the wax component to be used as the binder of the peeling layer and added into the above-mentioned emulsion of the resin particle, for example, microcrystalline wax, carnauba wax, paraffin wax, or the like, can be presented. Furthermore, various kinds of waxes, such as Fischer-Tropsch wax, various kinds of low molecular weight polyethylenes, wood wax, bee wax, whale wax, insect wax, wool wax, shellac wax, candelilla wax, petrolactam, polyester wax, partially denatured wax, aliphatic acid ester, and aliphatic acid amide can be used. It is also preferable to use the waxes in the emulsion state with water, an organic solvent, or a mixture thereof since it is used with the above-mentioned resin particle emulsion. The particle size of the waxes is not particularly limited.

In addition, in the case the layer retentivity (adhesion property for keeping the thermally fusible ink layer) is insufficient or the print is not sharp in a combination with the thermal transfer ink layer, a thermoplastic resin component is preferably added into the peeling layer. As the thermoplastic resin component, an adhesive resin component having an effect of providing the adhesion property as the binder to the substrate film, and an effect of improving the layer retentivity for the thermal transfer ink layer is preferable. Examples thereof include the above-mentioned resin particle with a 50° C. or less MFT, an acrylic based bonding agent, and latex such as NBR (nitrile rubber), SBR (styrene-butadiene rubber), and BR (butadiene rubber).

Moreover, if a sufficient layer retentivity and decline of the adhesion property after heating and printing can be obtained, the peeling layer can be formed from a material containing, as the main component, a resin component having the adhesion property and a wax.

Accordingly, it is preferable that the peeling layer contains at least two components selected from the group consisting of the thermoplastic resin particle, the thermoplastic resin (resin component having the adhesion property) and the wax.

The above-mentioned resin particle and wax are used preferably by a ratio of 5 to 90 parts by weight of the resin particle and 95 to 10 parts by weight of the wax with the total of both as 100 parts by weight. In the case the ratio of the wax is less than 10 parts by weight, the adhesion of the peeling layer to the substrate film is insufficient so as to have the film strength insufficiently so that a problem of so-called foil falling (undesirable peeling) is involved. In contrast, in the case the ratio of the wax is more than 95 parts by weight, the adhesion effect obtained from the surface ruggedness owing to the resin particle cannot be obtained so that the layer retentivity is lowered.

Moreover, the adhesive resin component can be added in the range from 3 to 70 parts by weight based on 100 parts by weight of the solid component forming the peeling layer. In the case the amount is less than 3 parts by weight, an effect of the layer retentivity is slight. In contrast, in the case the amount is more than 70 parts by weight, peeling after heating and printing is poor so that the sensitivity is deteriorated.

The peeling layer can be formed by coating the mixture emulsion containing the resin particle and the wax by the above-mentioned ratio on the substrate film surface and drying. The coating method can be selected optionally. It is preferable that the coating amount is about 0.2 to 5 g/$m^2$ based on the solid component, and the drying temperature is in the range of about 40 to 100° C., capable of maintaining the particle state of the resin particle. That is, it is preferable to dry at a temperature, at which the resin particle forms a coat film of the peeling layer in the particle state, but not form a fused solid film.

Since the drying time varied depending on the drying temperature, the air amount, the coating amount or the like, it cannot be determined on the whole, however, it is in general about 1 to 20 seconds.

Thermally Sensitive Color Developing Paper

As the thermally sensitive color developing paper used in the present invention, conventionally known thermally sensitive color developing papers can be used, and thus it is not particularly limited. Such a thermally sensitive color developing paper is provided with a color developing layer containing a colorless dye capable of developing a color by an acid, and a solid acid as the color developing agent on the surface of a substrate such as paper. The color developing layer can have a two-plies construction in which the dye and the color developing agent is separately contained in each the ply, or the dye and the color developing agent may be mixed in one layer. Moreover, in order to improve the stability of the color developing layer, the dye and/or the color developing agent may be provided in micro capsules comprising a material to be destroyed by heat.

Furthermore, although the developed color hue of the thermally sensitive color developing papery is not limited, the developed color hue of a thermally sensitive color developing paper which is commercially available or can easily be produced from a commercially available materials is any one of black, blue, and red in most cases. Among the developed color hues, in the case of the black color development, a hue satisfying $|a^*| \leqq 5$, $|b^*| \leqq 3$ is preferable in the present invention. Accordingly, an improved black hue can be recorded at the time of color mixture with a red hue of the thermal transfer ink layer.

Temporary Adhesive Layer

The thermally sensitive color developing paper and the thermal transfer film can be integrated by peelably bonding the thermal transfer ink layer side and the thermally sensitive color developing surface via a temporary adhesive layer. In the present invention, the thermally sensitive color developing paper also serves as the thermal transfer image receiving paper.

If the thermal transfer ink layer of the thermal transfer film has an appropriate adhesion property, it can be peelably bonded to the thermally sensitive color developing paper without providing the temporary adhesive layer.

It is preferable to form the temporary adhesive layer by using a thermoplastic resin having the bonding property, or a combination of a particle and a resin (at least one of them has the bonding property) as the main component in terms of the anti-abrasion property. It is also possible to add a wax component since the adhesion force can be improved owing to the wax component permeation among fibers in the case it is peelably bonded to a thermally sensitive color developing paper having a coarse surface. However, in the case a film material having a smooth surface is used as the thermally sensitive color developing paper, since the wax component inherently has a low adhesion force with the film material and furthermore the above-mentioned permeation effect (anchor effect) cannot be obtained because of the smooth surface, it is not preferable to add the wax component into the temporary adhesive layer in terms of the anti-abrasion property.

It is preferable that the temporary adhesive layer has (the adhesion force and the cohesive force between the substrate film and the temporary adhesive layer)>(the adhesion force between the temporary adhesive layer and the thermally sensitive color developing paper) at the time of non-printing, and (the adhesion force between the substrate film and the peeling layer)<(the adhesion force and the cohesive force between the peeling layer and the thermally sensitive color developing paper) at the time of printing.

The temporary adhesive layer mainly contains a resin, that is, a bonding resin as the main component or a combination of a particle and a resin (at least one of them has the bonding property) as the main component.

Moreover, it is necessary that it can be peelably bonded to the thermally sensitive color developing paper by pressure and heat lamination with a detachable adhesion force as well as a sufficient adhesion force with the thermally sensitive color developing paper can be obtained after heating and printing.

Furthermore, the temporary adhesive layer is required to have an adhesion strength to the extent preventing peeling which is owing to the shearing action in the carrying step in the printer, or preventing migration of the ink to a non-printed portion of the thermally sensitive color developing paper.

Examples of the resin of the temporary adhesive layer include an acrylic based resin, latex such as SBR, NBR, and BR, acrylic acid ester, an EAA resin, a polyester resin, an EVA (ethylene-vinyl acetate copolymer) resin, a polyurethane resin, a vinyl chloride-vinyl acetate copolymer resin, a styrene-acrylic copolymer resin, and a block copolymer thereof. Among these examples, the acrylic based resin, the latex such as SBR, NBR, and BR, the EAA resin or the like are particularly preferable in terms of improvement of the transfer sensitivity and prevention of greasing.

Moreover, as the particle material, a thermoplastic resin particle having a Tg in a range of 50 to 120° C. is effective for adjustment of the adhesion force and improvement of the sharpness at the time of printing and prevention of greasing. As a material forming the particle, the above-mentioned resin materials can be presented.

Furthermore, it is also possible to add a wax component in the range not to lower the abrasion property excessively in order to improve the thermal transfer sensitivity.

As the above-mentioned adhesive resins to be used for the temporary adhesive layer, those having the glass transitional temperature in the range from −90° C. to −50° C. are preferable. Specific examples thereof include a rubber based bonding resin, an acrylic based bonding resin, and a silicone based bonding resin. As to the form, any one such as a solvent solution type, an aqueous solution type, a hot melt type, and an aqueous or oil emulsion type can be used. Further, as a thermoplastic fine particle capable of maintaining the particle shape at an ordinary temperature but forming a film under heat, a polyethylene resin, an ionomer resin, an ethylene-vinyl acetate copolymer resin or the like, can be presented. Those having a minimum film formation temperature in a range of 50 to 150° C. are preferable.

As to the adhesion force (g) of such a temporary adhesive layer, those having the tensile shear strength in the range from 300 to 2,000 g obtained by cutting off a sample by a 25 mm (width)×55 mm (length) size, and measuring with a surface friction measurement device (HEIDEN-17, produced by Shinto Kagaku Corp.) by a 1,800 mm/min tensile speed are preferable. The temperature at the time of the measurement is 25° C. In the case the adhesion force is less than the above-mentioned range, the adhesion force between the thermal transfer film and the thermally sensitive color developing paper is so low that they can be peeled easily, and thus wrinkles can easily be generated in the thermal transfer film in the width direction at the time of printing. Moreover, in the case the adhesion force is more than the above-mentioned range, it is not preferable since greasing can easily be generated. However, if it is a peeling strength in a degree not to generate greasing, it is not problematic. That is, it can be used as long as an adhesion force at the time of non-printing is (the adhesion force and the cohesive force between the substrate film and the temporary adhesive layer)>(the peeling strength between the temporary adhesive layer and the thermally sensitive color developing paper).

The temporary adhesive layer comprising the above-mentioned components can be provided on the thermally sensitive color developing paper side, however, it is preferable to provide the temporary adhesive layer on the thermal transfer film side, namely on the thermal transfer ink layer surface in order to prevent leaving the bonding property on the printed product. In this case, since the bonding resin of the temporary adhesive layer is used as an aqueous emulsion, the thermal transfer ink layer cannot be damaged. Moreover, the coating method and the drying method for the emulsion are not particularly limited but various known methods can be selected.

The above-mentioned temporary adhesive layer preferably has the thickness in a range from 0.1 to 10 μm (0.05 to 5 g/$m^2$ in a solid component coating amount).

The thermal transfer film and the thermally sensitive color developing paper are adhered preferably by forming the temporary adhesive layer on the surface of the thermal transfer ink layer of the thermal transfer film, bonding the thermally sensitive color developing paper continuously on the temporary adhesive layer utilizing the adhesion property provided thereto, and winding up the same into a roll. At the time of winding, whether the thermally sensitive color developing paper or the thermal transfer film can be disposed to the outer side.

Recording Method

A recording method according to the present invention is for recording a plurality of colors in the member to be transferred (namely, the thermally sensitive color developing paper), using the combination of the above-described thermal transfer film and thermally sensitive color developing paper, in particular, the composite thermal transfer sheet, by varying the applied energy from a heating device such as the thermal head.

That is, the thermal transfer film is first lied on the thermally sensitive color developing paper so as to bring the thermally fusible ink layer of the former contact with the color-developing surface of the latter, then they are heated at a relatively low energy by a heating means such as a thermal head, and subsequently heated at a relatively high energy by the same or the other heating means. In this process, the hue of the thermal transfer ink layer or the hue of the developed color of the thermally sensitive color developing paper can be recorded on said color developing paper when the applied energy from the thermal head is low, and a plurality of colors can be recorded on the thermally sensitive color developing paper by color mixture of the transfer from the thermal transfer ink layer and the developed color of the thermally sensitive color developing paper when the applied energy is high, using the thermal transfer film and the thermally sensitive developing paper.

As to the hues of the above-mentioned cases with the low applied energy and the high applied energy, it is preferable to provide a high contrast of the hues of the printed product by varying the amount of the applied energy, for example, by providing the hue of the mixed color of the transfer from the thermal transfer ink layer and the developed color of the thermally sensitive color developing paper as a dark chroma color or a thick color in the case the applied energy is high, and providing the corresponding hue of the thermal transfer ink layer or the hue of the developed color of the thermally sensitive color developing paper recorded in the case the applied energy is low as a bright chroma color or a thin color.

It is also possible to record total three colors on the member to be transferred by recording the hue of the thermal transfer ink layer or the hue of the developed color of the thermally sensitive color developing paper in the case the applied energy from the thermal head is low, recording the hue of the mixed color of the transfer of the thermal transfer ink layer and the developed color of the thermally sensitive color developing paper in the case the applied energy is high, and then peeling off the thermal transfer film from the thermally sensitive color developing paper, and thereafter, directly recording on the thermally sensitive color developing paper by heating with the thermal head so as to have the self-coloration of the thermally sensitive color developing paper.

In the recording method according to the present invention, it is preferable to apply, for example, a 0.1 to 0.5 mJ/dot energy in the case the applied energy from the thermal head is low, and a 0.5 to 1.5 mJ/dot energy in the case the applied energy is high by varying the applied energy from the thermal head. Accordingly, the recording operation can be executed vividly with a high contrast in the recorded hue by the application of the low energy and the high energy. However, these values of the applied energy are changed optionally depending on the printing pressure, the platen hardness, the printing environment or the like.

Particularly, in the present invention, a plurality of colors can be recorded easily by using a large size printer dedicated for a thermally sensitive color developing paper, with a form of a composite thermal transfer sheet composed of a thermal transfer film and a thermally sensitive color developing paper peelably bonded together, and separating the applied energy from the thermal head in the low energy and the high energy, without the need of providing a supply mechanism or a peeling mechanism for the thermal transfer film and the image receiving sheet independently.

EXAMPLES

Hereinafter the present invention will be explained further specifically with reference to examples and comparative examples. The "part" or "%" in the explanation below is based on the weight unless otherwise specified.

In the following experiments, only the example 8 recorded the red hue by the developed color of the thermally sensitive color developing paper when applying a low heat energy, and recorded the black hue by color mixture mixing the transferred ink of the thermal transfer film with the developed color of the thermally sensitive color developing paper when applying a high heat energy. In the other examples and comparative examples, recording was carried out to the thermally sensitive color developing paper by the transferred ink of the thermal transfer film when applying a low heat energy, and it was done by color mixture mixing the transferred ink of the thermal transfer film with the developed color of the thermally sensitive color developing paper when applying a high heat energy.

Example 1

The below-mentioned composition kneaded at 120° C. was coated on one surface (the surface other than the back side) of a substrate film which is a polyethylene terephthalate film having a 4.5 μm thickness and provided with the back surface layer by a roll coat by a 3 μm thickness in the dry state to form a thermal transfer ink layer, thus producing a thermal transfer film of the example 1.

Coating Liquid Forming Thermal Transfer Ink Layer

C.I. pigment red 177: 10 parts

Paraffin wax (melting point 71° C.): 60 parts

Carnauba wax (melting point 82° C.): 10 parts

Ethylene-vinyl acetate copolymer resin (the melt index is 3,000, and the vinyl acetate content ratio is 28%): 20 parts Next, a commercially available black coloring type thermally sensitive color developing paper A (dye: crystal violet lactone, color developing agent: bisphenol A) with a* 5.5 and b* 2.0 was provided, and it was used in combination with the thermal transfer film of the example 1.

Example 2

The thermal transfer film produced and the thermally sensitive color developing paper both in the example 1 were temporarily bonded by using the below-mentioned materials, with the thermal transfer ink layer and the color developing layer facing to each other so as to produce a composite thermal transfer sheet according to the example 2.

Coating Liquid Forming Temporary Adhesive Layer

Acrylic based bonding agent emulsion (Tg −50° C., solid component 40%): 20 parts Carnauba wax emulsion (melting point 82° C., solid component 40%): 40 parts Isopropyl alcohol/water (weight ratio 2/1): 40 parts As to the bonding condition, a nip temperature was 40° C., a nip pressure 3 kg/cm$^2$, and the shear adhesion force between the thermal transfer film and the thermally sensitive color developing paper was 1,000 g.

Example 3

The same process as the example 2 was carried out except that the thermal transfer ink layer in the composite thermal transfer sheet produced in the example 2 was changed to the below-mentioned, thus producing a composite thermal transfer sheet according to the example 3.

Coating Liquid Forming Thermal Transfer Ink Layer

C.I. pigment red 177 (dianthraquinonyl red): 6 parts

Paraffin wax (melting point 71° C.): 64 parts

Carnauba wax (melting point 82° C.): 10 parts

Ethylene-vinyl acetate copolymer resin (the melt index is 3,000, and the vinyl acetate content ratio is 28%): 20 parts Example 4

The same process as the example 2 was carried out except that the thermal transfer ink layer in the composite thermal transfer sheet produced in the example 2 was changed to the below-mentioned, thus producing a composite thermal transfer sheet according to the example 4.

Coating Liquid Forming Thermal Transfer Ink Layer

C.I. pigment blue 15:4: 10 parts

Paraffin wax (melting point 71° C.): 60 parts

Carnauba wax (melting point 82° C.): 10 parts

Ethylene-vinyl acetate copolymer resin (the melt index is 3,000, and the vinyl acetate content ratio is 28%): 20 parts Example 5

The same process as the example 2 was carried out except that the thermal transfer ink layer in the composite thermal transfer sheet produced in the example 2 was changed to the below-mentioned, thus producing a composite thermal transfer sheet according to the example 5.

Coating Liquid Forming Thermal Transfer Ink Layer

C.I. pigment red 177: 5 parts

C.I. pigment red 48:3: 2 parts

Paraffin wax (melting point 71° C.): 63 parts

Carnauba wax (melting point 82° C.): 10 parts

Ethylene-vinyl acetate copolymer resin (the melt index is 3,000, and the vinyl acetate content ratio is 28%): 20 parts Example 6

The same process as the example 3 was carried out except that the thermally sensitive color developing paper in the composite thermal transfer sheet produced in the example 3 was changed to a commercially available black coloring type thermally sensitive color developing paper B (dye: crystal violet lactone, color developing agent: bisphenol A) with a* 4.8 and b* 1.2, thus producing a composite thermal transfer sheet according to the example 6.

Example 7

The same process as the example 3 was carried out except that the thermally sensitive color developing paper in the composite thermal transfer sheet produced in the example 3 was changed to a commercially available black coloring type thermally sensitive color developing paper C (dye: crystal violet lactone, color developing agent: bisphenol A) with a* 2.8 and b* 0.0, thus producing a composite thermal transfer sheet according to the example 7.

Example 8

The below-mentioned composition kneaded at 120° C. was coated on one surface (the surface other than the back side) of a substrate film which is the same as used in the example 1 with the back surface layer provided on the back side by a roll coat by a 3 μm thickness in the dry state to form a thermal transfer ink layer, thus producing a thermal transfer film of the example 8.

Coating Liquid Forming Thermal Transfer Ink Layer

Carbon black: 15 parts

Polyethylene wax (melting point 130° C.): 70 parts

Carnauba wax (melting point 82° C.): 5 parts

Ethylene-vinyl acetate copolymer resin (the melt index is 400, and the vinyl acetate content ratio is 10%): 10 parts Next, a commercially available red coloring type thermally sensitive color developing paper D with a* 58.2 and b* 24.7 was provided, and it was used in combination with the thermal transfer film of the example 8.

Example 9

The same process as the example 7 was carried out except that the thermal transfer ink layer in the composite thermal transfer sheet produced in the example 7 was changed to the below-mentioned, thus producing a composite thermal transfer sheet according to the example 9.

Coating Liquid Forming Thermal Transfer Ink Layer

C. I. pigment violet 37 (dioxazine violet): 10 parts

Paraffin wax (melting point 71° C.): 60 parts

Carnauba wax (melting point 82° C.): 10 parts

Ethylene-vinyl acetate copolymer resin (the melt index is 3,000, and the vinyl acetate content ratio is 28%): 20 parts Example 10

The same process as the example 7 was carried out except that the thermal transfer ink layer and the thermally sensitive color developing paper in the composite thermal transfer sheet produced in the example 7 was changed to the below-mentioned, thus producing a composite thermal transfer sheet according to the example 10.

Coating Liquid Forming Thermal Transfer Ink Layer

C. I. pigment green 7 (phthalocyanine green): 10 parts

Paraffin wax (melting point 71° C.): 60 parts

Carnauba wax (melting point 82° C.): 10 parts

Ethylene-vinyl acetate copolymer resin (the melt index is 3,000, and the vinyl acetate content ratio is 28%): 20 parts Paraffin wax (melting point 71° C.): 60 parts Carnauba wax (melting point 82° C.): 10 parts Ethylene-vinyl acetate copolymer resin (the melt index is 3,000, and the vinyl acetate content ratio is 28%): 20 parts Comparative Example 1

The same process as the example 2 was carried out except that the thermal transfer ink layer in the composite thermal transfer sheet produced in the example 2 was changed to the below-mentioned, thus producing a composite thermal transfer sheet according to the comparative example 1.

Coating Liquid Forming Thermal Transfer Ink Layer

C. I. pigment red 48:3 (Sr salt of a permanent red 2B): 10 parts

Paraffin wax (melting point 71° C.): 60 parts

Carnauba wax (melting point 82° C.): 10 parts

Ethylene-vinyl acetate copolymer resin (the melt index is 3,000, and the vinyl acetate content ratio is 28%): 20 parts Test pattern images were formed on the color developing papers with the respective combinations of the thermal transfer film and said thermally sensitive color developing paper, or the composite thermal transfer sheets of the examples by means of a printer capable of applying a low energy and a high energy separately. Then, the L*, a*, and b* values of the obtained printed products were measured with respect to the a portion applied with a low energy and that applied with a high energy, and further, the hues were evaluated visibly.

The low energy application condition was 0.3 mJ/dot, and the high energy application condition was 1.0 mJ/dot.

Evaluation results are shown in Table 1.

TABLE 1

| | Low energy application | | | | High energy application | | | |
|---|---|---|---|---|---|---|---|---|
| | a* | b* | c* | Hue | a* | b* | c* | Hue |
| Example 1 | 49.5 | 21.3 | 53.7 | [0004]Red/good | 13.2 | 6.3 | 14.6 | Black/good |
| Example 2 | 49.3 | 21.5 | 53.8 | Red/good | 13.1 | 6.2 | 14.5 | Black/good |
| Example 3 | 48.1 | 16.5 | 51.0 | Red/good | 12.5 | 5.3 | 13.6 | Black/good |
| Example 4 | 11.8 | −43.7 | 45.3 | Blue/good | −1.6 | −1.3 | 1.6 | Black/good |
| Example 5 | 53.4 | 16.6 | 55.9 | Red/good | 12.7 | 7.1 | 14.6 | Black/good |
| Example 6 | 48.0 | 16.4 | 50.7 | Red/good | 10.2 | 4.4 | 11.1 | Black/good |
| Example 7 | 48.2 | 16.3 | 50.9 | Red/good | 8.5 | 3.2 | 9.1 | Black/good |
| Example 8 | 58.2 | 24.7 | 63.2 | Red/good | 0.6 | 0.3 | 0.7 | Black/good |
| Example 9 | 41.5 | −42.2 | 59.2 | Violet/good | 13.6 | −4.2 | 14.2 | Black/good |
| Example 10 | −50.0 | −4.2 | 50.2 | Green/good | 3.3 | −43.8 | 43.9 | Blue/good |
| Example 11 | 42.1 | 13.3 | 44.1 | Red/good | 5.1 | 2.1 | 5.5 | Black/good |
| Comparative example 1 | 60.3 | 25.1 | 65.3 | Poor due to lack of vividness in red | 14.8 | 11.1 | 18.5 | poor due to lack of dark blackness |

Thermally Sensitive Color Developing Paper

It was a blue-developing type with a* 40.1, b* −65.2 and C* 76.5.

Example 11

The same process as the example 7 was carried out except that the thermal transfer ink layer in the composite thermal transfer sheet produced in the example 7 was changed to the below-mentioned, thus producing a composite thermal transfer sheet according to the example 11.

Coating Liquid Forming Thermal Transfer Ink Layer

C. I. pigment red 177: 9 parts

Carbon black: 1 parts

What is claimed is:

1. A combination of a thermal transfer film and a thermally sensitive color developing paper, with the thermal transfer film provided with a thermally fusible ink layer to be transferred onto the thermally sensitive color developing paper on one surface of a substrate film, and the thermally sensitive color developing paper capable of developing a color of a hue different from that of the thermally fusible ink layer of the thermal transfer film, wherein a red hue can be recorded on the thermally sensitive color developing paper by the transfer of the thermally fusible ink or by the developed color of the thermally sensitive color developing paper in the case the applied energy is relatively low, a plurality of colors can be recorded on the thermally sensitive color developing paper according to a color mixture of the transfer of the thermally fusible ink and the developed color of the thermally sensitive color developing paper in the case the applied energy is relatively high, and a* is 40 to 70, b* is 0 to 25, and C* is 40 to 75 in the red hue recorded by the transfer of the thermally fusible ink or by the developed color of the thermally sensitive color developing paper, and a* is 0 to 20, b* is 0 to 10, and C* is 0 to 20 in the black hue recorded by the color mixture of the transfer of the thermally fusible ink and the developed color of the thermally sensitive color developing paper.

2. The combination according to claim 1, wherein the thermally fusible ink layer of the thermal transfer film has a red hue and the thermally sensitive color developing paper generates a black hue of $|a^*| \leqq 5$ and $|b^*| \leqq 3$.

3. The combination according to claim 1, wherein a pigment of a C. I. Pigment red 177 is contained in the thermally fusible ink layer of the thermal transfer film.

4. The combination according to claim 1, wherein a pigment of a C. I. Pigment blue 15:4 is contained in the thermally fusible ink layer of the thermal transfer film.

5. The combination according to claim 1, wherein a black pigment is contained in the thermally fusible ink layer of the thermal transfer film.

6. The combination according to claim 1, wherein the thermal transfer film and the thermally sensitive color developing paper are peelably bonded together with the thermally fusible ink layer and the color developing surface facing to each other.

7. The combination according to claim 1, wherein the thermal transfer film and the thermally sensitive color developing paper are peelably bonded together via a temporary adhesive layer.

8. A combination of a thermal transfer film and a thermally sensitive color developing paper, with the thermal transfer film provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue and red, which is different from the hue of the thermally fusible ink layer of the thermal transfer film, wherein a blue hue can be recorded on the thermally sensitive color developing paper by the transfer of the thermally fusible ink or by the developed color of the thermally sensitive color developing paper in the case the applied energy is relatively low, a plurality of colors can be recorded on the thermally sensitive color developing paper according to a color mixture of the transfer of the thermally fusible ink and the developed color of the thermally sensitive color developing paper in the case the applied energy is relatively high, and a* is 0 to 30, b* is −40 to −70, and C* is 30 to 77 in the blue hue recorded by the transfer of the thermally fusible ink or by the developed color of the thermally sensitive color developing paper, and a* is −10 to 10, b* is −15 to 10, and C* is 0 to 18 in the black hue recorded by the color mixture of the transfer of the thermally fusible ink and the developed color of the thermally sensitive color developing paper.

9. A combination of a thermal transfer film and a thermally sensitive color developing paper, with the thermal transfer film provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue and red, which is different from the hue of the thermally fusible ink layer of the thermal transfer film, wherein a purple hue can be recorded on the thermally sensitive color developing paper by the transfer of the thermally fusible ink or by the developed color of the thermally sensitive color developing paper in the case the applied energy is relatively low, a plurality of colors can be recorded on the thermally sensitive color developing paper according to a color mixture of the transfer of the thermally fusible ink and the developed color of the thermally sensitive color developing paper in the case the applied energy is relatively high, and a* is 30 to 50, b* is −30 to −50, and C* is 42 to 71 in the purple hue recorded by the transfer of the thermally fusible ink, and a* is −10 to 20, b* is −15 to 10, and C* is 0 to 25 in the black hue recorded by the color mixture of the transfer of the thermally fusible ink and the developed color of the thermally sensitive color developing paper.

10. A combination of a thermal transfer film and a thermally sensitive color developing paper, with the thermal transfer film provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue and red, which is different from the hue of the thermally fusible ink layer of the thermal transfer film, wherein a green hue can be recorded on the thermally sensitive color developing paper by the transfer of the thermally fusible ink in the case the applied energy is relatively low, a plurality of colors can be recorded on the thermally sensitive color developing paper according to a color mixture of the transfer of the thermally fusible ink and the developed color of the thermally sensitive color developing paper in the case the applied energy is relatively high, and a* is −40 to −70, b* is −15 to 5, and C* is 0 to 72 in the green hue recorded by the transfer of the thermally fusible ink, and a* is −5 to 15, b* is −70 to −30, and C* is 30 to 72 in the blue hue recorded by the color mixture of the transfer of the thermally fusible ink and the developed color of the thermally sensitive color developing paper.

11. A combination of a thermal transfer film and a thermally sensitive color developing paper, with the thermal transfer film provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue and red, which is different from the hue of the thermally fusible ink layer of the thermal transfer film, wherein a pigment of a C.I. pigment red 177 is contained in the thermally fusible ink layer of the thermal transfer film.

12. The combination according to claim 8, wherein a pigment of a C.I. pigment red 15:4 is contained in the thermally fusible ink layer of the thermal transfer film.

13. The combination according to any one of claim 8 or 9, wherein a black pigment is contained in the thermally fusible ink layer of the thermal transfer film.

14. A recording method of heating a thermal transfer film and a thermally sensitive color developing paper brought into contact with each other, using a thermal transfer film provided with a thermally fusible ink layer on one surface of a substrate film, capable of recording a red hue with a* 40 to 70, b* 0 to 25, and C* 40 to 75 on the color developing surface of the thermally sensitive color developing paper at a thermal transfer temperature lower than the color developing temperature of the thermally sensitive color developing paper, and a thermally sensitive color developing paper capable of generating a hue different from that of the thermally fusible ink layer of the thermal transfer film, for recording a black hue with a* 0 to 20, b* 0 to 10, and C* 0 to 20 by the color mixture of the transfer of the thermally fusible ink and the developed color of the thermally sensitive color developing paper, wherein a red hue is recorded on the thermally sensitive color developing paper by the transfer of the thermally fusible ink in the case the applied energy is relatively low, and a plurality of colors is recorded on the thermally sensitive color developing paper by the color mixture of the transfer of the thermally fusible ink and the developed color of the thermally sensitive color developing paper in the case the applied energy is relatively high.

15. The recording method according to claim 14, wherein a pigment of a C. I. Pigment red 177 is contained in the thermally fusible ink layer of the thermal transfer film.

16. A recording method of heating a thermal transfer film and a thermally sensitive color developing paper brought into contact with each other, using a thermal transfer film provided with a thermally fusible ink layer on one surface of a substrate film, capable of recording a hue different from the developed color of the thermally sensitive color developing paper on the color developing surface of the thermally sensitive color developing paper, and a thermally sensitive color developing paper capable of generating a red hue with a* 40 to 70, b* 0 to 25, and C* 40 to 75 at a temperature lower than the thermal transfer temperature of the thermal transfer film as well as a black hue with a* 0 to 20, b* 0 to 10, and C* 0 to 20 by the color mixture of the transfer of the thermally fusible ink and the developed color of the thermally sensitive color developing paper, wherein a red hue is recorded on the thermally sensitive color developing paper by the color development of the thermally sensitive color developing paper in the case the applied energy is relatively low, and a plurality of colors is recorded on the thermally sensitive color developing paper by the color mixture of the transfer of the thermally fusible ink and the developed color of the thermally sensitive color developing paper in the case the applied energy is relatively high.

17. The recording method according to claim 16, wherein a pigment of a C. I. Pigment blue 15:4 is contained in the thermally fusible ink layer of the thermal transfer film.

18. The recording method according to claim 16, wherein a black pigment is contained in the thermally fusible ink layer of the thermal transfer film.

19. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, having a thermal transfer temperature lower than the color developing temperature of the thermally sensitive color developing paper, and a thermally sensitive color developing paper for generating black, blue or red, capable of generating a hue different from that of the thermally fusible ink layer of the transfer film, wherein the hue of thermally fusible ink is recorded on the thermally sensitive color developing paper by the transfer of the thermally fusible ink in the case the applied energy is relatively low, a plurality of colors are recorded on the thermally sensitive color developing paper according by the color mixture of the transfer of the thermally fusible ink and the developed color of the thermally sensitive color developing paper in the case the applied energy is relatively high, wherein the thermal transfer film is capable of recording a blue hue with a* 0 to 30, b* −30 to −70, and C* 30 to 77 on the color developing surface of the thermally sensitive color developing paper at a thermal transfer temperature lower than the color developing temperature of the thermally sensitive color developing paper, the thermally sensitive color developing paper is capable of recording a black hue with a* −10 to 10, b* −15 to 10, and C* 0 to 18 by the color mixture of the transfer of the thermally fusible ink and the developed color of the thermally sensitive color developing paper, a blue hue is recorded on the thermally sensitive color developing paper by the transfer of the thermally fusible ink in the case the applied energy is relatively low, and a plurality of colors are recorded on the thermally sensitive color developing paper by the color mixture of the transfer of the thermally fusible ink and the developed color of the thermally sensitive color developing paper in the case the applied energy is relatively high.

20. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, having a thermal transfer temperature lower than the color developing temperature of the thermally sensitive color developing paper, and a thermally sensitive color developing paper for generating black, blue or red, capable of generating a hue different from that of the thermally fusible ink layer of the transfer film, wherein the hue of thermally fusible ink is recorded on the thermally sensitive color developing paper by the transfer of the thermally fusible ink in the case the applied energy is relatively low, a plurality of colors are recorded on the thermally sensitive color developing paper according by the color mixture of the transfer of the thermally fusible ink and the developed color of the thermally sensitive color developing paper in the case the applied energy is relatively high, wherein the thermal transfer film is capable of recording a purple hue with a* 30 to 50, b* −30 to −50, and C* 42 to 71 on the color developing surface of the thermally sensitive color developing paper at a thermal transfer temperature lower than the color developing temperature of the thermally sensitive color developing paper, the thermally sensitive color developing paper is capable of recording a black hue with a* −10 to 20, b* −15 to 10, and C* 0 to 25 by the color mixture of the transfer of the thermally fusible ink and the developed color of the thermally sensitive color developing paper, a purple hue is recorded on the thermally sensitive color developing paper by the transfer of the thermally fusible ink in the case the applied energy is relatively low, and a plurality of colors are recorded on the thermally sensitive color developing paper by the color mixture of the transfer of the thermally fusible ink and the developed color of the thermally sensitive color developing paper in the case the applied energy is relatively high.

21. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, having a thermal transfer temperature lower than the color developing temperature of the thermally sensitive color developing paper, and a thermally sensitive color developing paper for generating black, blue or red, capable of generating a hue different from that of the thermally fusible ink layer of the transfer film, wherein the hue of thermally fusible ink is recorded on the thermally sensitive color developing paper by the transfer of the thermally fusible ink in the case the applied energy is relatively low, a plurality of colors are recorded on the thermally sensitive color developing paper according by the color mixture of the transfer of the thermally fusible ink and the developed color of the thermally sensitive color developing paper in the case the applied energy is relatively high, wherein the thermal transfer film is capable of recording a green hue with a* −40 to −70, b* −15 to 5, and C* 0 to 72 on the color developing surface of the thermally sensitive color developing paper at a thermal transfer temperature lower than the color developing temperature of the thermally sensitive color developing paper, the thermally sensitive color developing paper is capable of recording a blue hue with a* −5 to 15, b* −70 to −30, and C* 30 to 72 by the color mixture of the transfer of the thermally fusible ink and the developed color of the thermally sensitive color developing paper, a green hue is recorded on the thermally sensitive color developing paper by the transfer of the thermally fusible ink in the case the applied energy is relatively low, and a plurality of colors are recorded on the thermally sensitive color developing paper by the color mixture of the transfer of the thermally fusible ink and the developed color of the thermally sensitive color developing paper in the case the applied energy is relatively high.

22. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, having a thermal transfer temperature lower than the color developing temperature of the thermally sensitive color developing paper, and a thermally sensitive color developing paper for generating black, blue or red, capable of generating a hue different from that of the thermally fusible ink layer of the transfer film, wherein the hue of thermally fusible ink is recorded on the thermally sensitive color developing paper by the transfer of the thermally fusible ink in the case the applied energy is relatively low, a plurality of colors are recorded on the thermally sensitive color developing paper according by the color mixture of the transfer of the thermally fusible ink and the developed color of the thermally sensitive color developing paper in the case the applied energy is relatively high, wherein a pigment of a C.I. Pigment red 177 is contained in the thermally fusible ink layer of the thermal transfer film.

23. The recording method according to claim 19, wherein a pigment of a C.I. Pigment blue 15:4 is contained in the thermally fusible ink layer of the thermal transfer film.

24. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, and a thermally sensitive color developing paper for generating black, blue or red, capable of generating a hue different from that of the thermally fusible ink layer of the transfer film, having a color developing temperature lower than the thermal transfer temperature of the thermal transfer film, wherein the hue of the thermally sensitive color developing paper is recorded in the case the applied energy is relatively low, and a plurality of colors are recorded on the thermally sensitive color developing paper according by the color mixture of the transfer of the thermally fusible ink and the developed color of the thermally sensitive color developing paper in the case the applied energy is relatively high, wherein the thermally sensitive color developing paper is capable of generating a blue hue with a* 0 to 30, b* −30 to −70, and C* 30 to 77 at a temperature lower than the thermal transfer temperature of the thermal transfer film as well as a black hue with a* −10 to 10, b* −15 to 10, and C* 0 to 18 by the color mixture of the transfer of the thermally fusible ink and the developed color of the thermally sensitive color developing paper, a blue hue is recorded on the thermally sensitive color developing paper by the color development of the thermally sensitive color developing paper in the case the applied energy is relatively low, and a plurality of colors are recorded on the thermally sensitive color developing paper by the color mixture of the transfer of the thermally fusible ink and the developed color of the thermally sensitive color developing paper in the case the applied energy is relatively high.

25. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, and a thermally sensitive color developing paper for generating black, blue or red, capable of generating a hue different from that of the thermally fusible ink layer of the transfer film, having a color developing temperature lower than the thermal transfer temperature of the thermal transfer film, wherein the hue of the thermally sensitive color developing paper is recorded in the case the applied energy is relatively low, and a plurality of colors are recorded on the thermally sensitive color developing paper according by the color mixture of the transfer of the thermally fusible ink and the developed color of the thermally sensitive color developing paper in the case the applied energy is relatively high, wherein a pigment of a C.I. Pigment red 177 is contained in the thermally fusible ink layer of the thermal transfer film.

26. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, and a thermally sensitive color developing paper for generating black, blue or red, capable of generating a hue different from that of the thermally fusible ink layer of the transfer film, having a color developing temperature lower than the thermal transfer temperature of the thermal transfer film, wherein the hue of the thermally sensitive color developing paper is recorded in the case the applied energy is relatively low, and a plurality of colors are recorded on the thermally sensitive color developing paper according by the color mixture of the transfer of the thermally fusible ink and the developed color of the thermally sensitive color developing paper in the case the applied energy is relatively high, wherein a pigment of a C.I. Pigment blue 15:4 is contained in the thermally fusible ink layer of the thermal transfer film.

27. The recording method according to claim 24 wherein a black pigment is contained in the thermally fusible ink layer of the thermal transfer film.

28. A combination of a thermal transfer film and a thermally sensitive color developing paper, with the thermal transfer film provided with a thermally fusible ink layer to be transferred onto the thermally sensitive color developing paper on one surface of a substrate film, wherein the thermally fusible ink layer contains at least one selected from the group consisting of blue, green, red, purple, and black pigments, and the thermally sensitive color developing paper is capable of developing a color with hue of any one selected from the group consisting of black, blue and red, which is different from the hue of the thermally fusible ink layer of the thermal transfer film, wherein a pigment of a C.I. pigment red 15:4 is contained in the thermally fusible ink layer of the thermal transfer film.

29. A recording method of heating a thermal transfer film and a thermally sensitive color developing paper brought into contact with each other, using a thermal transfer film provided with a thermally fusible ink layer containing at least one selected from the group consisting of blue, green, red, purple and black pigments, on one surface of a substrate film, having a thermal transfer temperature lower than the color developing temperature of the thermally sensitive color developing paper, and a thermally sensitive color developing paper for generating black, blue or red, capable of generating a hue different from that of the thermally fusible ink layer of the transfer film, wherein the hue of thermally fusible ink is recorded on the thermally sensitive color developing paper by the transfer of the thermally fusible ink in the case the applied energy is relatively low, a plurality of colors are recorded on the thermally sensitive color developing paper according by the color mixture of the transfer of the thermally fusible ink and the developed color of the thermally sensitive color developing paper in the case the applied energy is relatively high, wherein a pigment of a C.I. pigment blue 15:4 is contained in the thermally fusible ink layer of the thermal transfer film.

* * * * *